United States Patent [19]

Shigekane

[11] Patent Number: 4,739,199

[45] Date of Patent: Apr. 19, 1988

[54] HIGH SWITCHING SPEED SEMICONDUCTOR DEVICE

[75] Inventor: Hisao Shigekane, Kanagawa, Japan

[73] Assignee: Fuji Electric Company Ltd., Japan

[21] Appl. No.: 875,740

[22] Filed: Jun. 18, 1986

[30] Foreign Application Priority Data

Jun. 18, 1985 [JP] Japan .............................. 60-132661
Jun. 18, 1985 [JP] Japan .............................. 60-132662

[51] Int. Cl.$^4$ ................... H03K 17/60; H03K 21/00; G05F 1/573; G06M 1/10
[52] U.S. Cl. .................................. 307/570; 307/571; 307/200 B; 307/300; 307/549; 307/572; 307/254; 323/278; 323/289; 377/89; 377/91; 377/33
[58] Field of Search ............... 307/200 B, 300, 542, 307/544, 547, 549, 566, 570, 572, 93, 318, 254; 323/278, 289; 377/89, 91, 33

Primary Examiner—Stanley D. Miller
Assistant Examiner—M. R. Wambach
Attorney, Agent, or Firm—Stevens, Davis, Miller & Mosher

[57] ABSTRACT

A semiconductor device comprising first and second transistors connected in series with one another to pass a primary current upon receipt of a control signal at the gate of the second transistor. The first transistor is coupled to receive a base current from a secondary power source. A third transistor is coupled to have a primary current path to shunt the base current away from the first transistor upon conduction of the third transistor. A capacitor is connected between the base of the third transistor and the base of the first transistor so that, at the moment the second transistor ceases conduction in response to the control signal, a voltage gradient is generated between the base of the first transistor and the base of the third transistor, causing the current from the secondary power source to charge the capacitor and thus render the third transistor conductive, thereby shunting the base current from the secondary power source away from the base of the first transistor. The action of the capacitor serves to smooth the rise time of the voltage generated by the switching of the second transistor, and thus reduce the magnitude of spike voltages which can damage the first and second transistors and cause heat build-up.

10 Claims, 3 Drawing Sheets

HIGH SWITCHING SPEED SEMICONDUCTOR DEVICE

BACKGROUND OF THE INVENTION

I. Field of the Invention

The present invention relates to a semiconductor device comprising two transistors having primary current paths connected in series with one another to conduct a primary current through those primary current paths upon receipt of a control signal.

II. Background of the Invention

FIG. 1 illustrates an example of a prior art semiconductor device in the field of the present invention. The device of FIG. 1 comprises a main bipolar transistor Q1, a field effect transistor (FET) Q2, a zener diode ZD1 and a secondary current source comprising a resistor R1 and a voltage supply $E_B$. As shown in FIG. 1, the emitter of transistor Q1 is connected to the drain of transistor Q2 to thereby couple the primary (collector/emitter) current path of transistor Q1 in series with the primary (drain/source) current path of transistor Q2. The resultant cascade connection of transistors Q1 and Q2 forms an effective composite transistor comprising transistors Q1 and Q2.

As is further shown in FIG. 1, one pole of voltage supply $E_B$ is connected to the source of transistor of Q2, while the other pole is connected to the base of transistor Q1 through resistor R1. In addition, the cathode of zener diode ZD1 is connected to the base of transistor Q1 and the anode of zener diode ZD1 is connected to the source of transistor Q2. The gate of transistor Q2 is coupled to receive a control signal $e_G$.

In operation of the prior art device of FIG. 1, a primary current $I_C$ is applied to the collector of transistor Q1 and passes the primary (collector/emitter) current path of transistor Q1 and the primary (drain/source) current path of transistor Q2 when both transistors Q1 and Q2 are turned ON. With transistors Q1 and Q2 ON, the primary current $I_C$ may be passed through transistors Q1 and Q2 to a load (not shown) coupled to the source of transistor Q2.

The conduction of transistor Q2 is governed by the state of the control signal $e_G$ applied to the gate of transistor Q2. Control signal $e_G$ is supplied by a drive circuit (not shown) as is well known to those skilled in the art. When control signal $e_G$ is HIGH, transistor Q2 is turned ON. In this condition, a base current $I_{B1}$ is supplied from voltage supply $E_B$ through resistor R1 to the base of transistor Q1, allowing transistor Q1 to also turn ON. To achieve this result, the value of voltage supply $E_B$ must be sufficiently large to drive transistor Q1 ON as transistor Q2 is turned ON by receipt of control signal $e_G$.

As transistor Q2 turns ON, the voltage $V_{DS}$ from the drain to the source of transistor Q2 (plus the base to emitter voltage drop of transistor Q1) drops below the breakdown voltage of zener diode ZD1, permitting all of base current $I_{B1}$ to pass through the base of transistor Q1. When transistor Q2 is OFF, $V_{DS}$ is sufficiently high to cause all of base current $I_{B1}$ to be shunted from power supply $E_B$, through zener diode Z1D, away from the base of transistor Q1. However, the base current $I_{B1}$ to transistor Q1 rises sharply as transistor Q2 is turned ON due to the steep drop of voltage $V_{DS}$, and consequent non-conductance of diode Z1D. With transistor Q2 ON, zener diode Z1D is in the OFF (non-conductive) state.

Transistors Q1 and Q2 are turned OFF as follows: When control signal $e_G$ is LOW, transistor Q2 is turned OFF. Since transistor Q2 is preferably a field effect transistor (FET), Q2 turns off quickly, causing voltage $V_{DS}$ between the drain and source of transistor Q2 to rise quickly, thereby quickly turning OFF the primary current $I_C$ flowing through transistor Q2. At the same time $V_{DS}$ rises, zener diode ZD1 becomes conductive, thereby shunting secondary or base current $I_{B1}$ from the base of transistor Q1, through zener diode ZD1, to the source of transistor Q2. With this shunting of base current, accumulated carriers at the base of transister Q1 are rapidly dissipated to the source of transistor Q2, thereby rapidly turning OFF transistor Q1. As a consequence, both transistors Q1 and Q2 are rapidly turned OFF, thereby ceasing conduction of primary current $I_C$ through transistors Q1 and Q2.

The circuit of FIG. 1 is generally intended to obtain high switching speed with high voltage resistance by combining a switching element of high speed, low voltage resistance in the form of FET Q2 and a switching element of high voltage resistance in the form of bipolar transistor Q1. Although the switching speed of FET Q2 is generally greater than that of bipolar transistor Q1, the arrangement of FIG. 2 allows transistor Q1 to also be turned OFF rapidly.

In the circuit of FIG. 1, the zener diode ZD1 is operative because the voltage $V_{DS}$ between the drain and source of transistor Q2 (plus the base to emitter voltage drop of transistor Q1), at the precise moment Q2 turns OFF, assumes a higher voltage than the breakdown voltage or limit voltage for turning ON (switching rejection voltage BDVS) zener diode ZD1. Thus, at essentially the precise moment the primary current through transistor Q2 is turned OFF through operation of transistor Q2, the secondary or effective base current to transistor Q1 is shunted from the base of transistor Q1 through zener diode ZD1, thereby also turning transistor Q1 quickly OFF.

With transistors Q1 and Q2 off, the secondary or base current from voltage supply $E_B$ is shunted uselessly through zener diode ZD1 to the source of transistor Q2. On the other hand when transistors Q1 and Q2 are turned on, $V_{DS}$ between the drain and source of FET Q2 (plus the base to emitter voltage drop of transistor Q2) is less than the breakdown or limit voltage for zener diode ZD1, zener diode ZD1 is OFF, and the secondary or base current from voltage supply $E_B$ is allowed to pass into the base of transistor Q1.

In actual practice of the device of FIG. 1, wiring exists between the emitter of transistor Q1 and the drain of transistor Q2. This wiring exhibits a floating inductance L1 between the emitter E of transistor Q1 and the drain D of transistor Q2. A floating inductance L1 (shown in FIG. 4) may generate a transitional excess voltage (spike voltage) when the primary current path is interrupted by transistor Q2 switching OFF. That spike voltage may damage or destroy transistors Q1 and Q2.

In addition, when Q2 is turned OFF, the carriers accumulated at the base of Q1 flow through zener diode ZD1. Because the avalanche voltage of ZD1 is high, the heat generation is increased in ZD1 and it is necessary to use a large capacity, expensive zener diode as ZD1.

In view of the foregoing, an object of the present invention is to provide a semiconductor device which minimizes the potential negative effects of floating inductance.

Another object of the invention is to provide means corresponding to zener diode ZD1 which is less expensive and which generates less heat.

Yet another object of the present invention is to provide a semiconductor device wherein the heat generated in means corresponding to the zener diode ZD1 is reduced, so that a smaller capacity and less expensive means may be in the semiconductor device.

Additional objects and advantages of the invention will be set forth in the description which follows, and in part will be obvious from the description or may be learned by practice of the invention.

SUMMARY OF THE INVENTION

To achieve the foregoing objects, and in accordance with the purposes of the invention as embodied and broadly described herein, a semiconductor device for conducting primary current upon receipt of a control signal is provided which comprises: (a) a first transistor having a control electrode and a primary current path; (b) a second transistor having a control electrode coupled to receive the control signal and having a primary current path coupled in series with the primary current path of the first transistor at a common junction of the first and second transistors, the series primary current paths coupled to receive the before mentioned primary current; (c) a secondary current source coupled to the control electrode of the first transistor; (d) a third transistor having a control electrode and having a current path coupled to shunt the secondary current from the secondary current source away from the control electrode of the first transistor upon conduction of the third transistor; (e) a capacitor coupled between the control electrode of the third transistor and the control electrode of the first transistor and (f) a resistor coupled between the control electrode of the third transistor and the source of the second transistor, such that the secondary current is shunted from the control electrode of the first transistor when the control signal switches the second transistor to a non-conductive state and the secondary current is provided to the control electrode of the first transistor when the control signal switches the second transistor to a conductive state.

Preferably, the first transistor comprises a bipolar transistor, the second transistor comprises a field effect transistor, and the third transistor comprises a bipolar transistor.

It is still further preferable that a zener diode be coupled between the control electrode of the third transistor and the control electrode of the first transistor in parallel with the capacitor, the zener diode having a polarity oriented to oppose current flow to the control electrode of the third transistor until the breakdown voltage of the second zener diode is exceeded.

In another embodiment of the subject invention, zener diodes are connected between the control electrode of the third transistor and the collector of the first transistor and the drain of the second transistor, respectively, oriented in such a way that spike voltages generated by stray line inductance are shunted to the control electrode of the third transistor.

DESCRIPTION OF THE PREFERRED EMBODIMENT

Reference will now be made in detail to the present preferred embodiment of the invention as illustrated in the accompanying drawings, wherein elements of like type are identified by the same symbolic notations.

Figure 2:
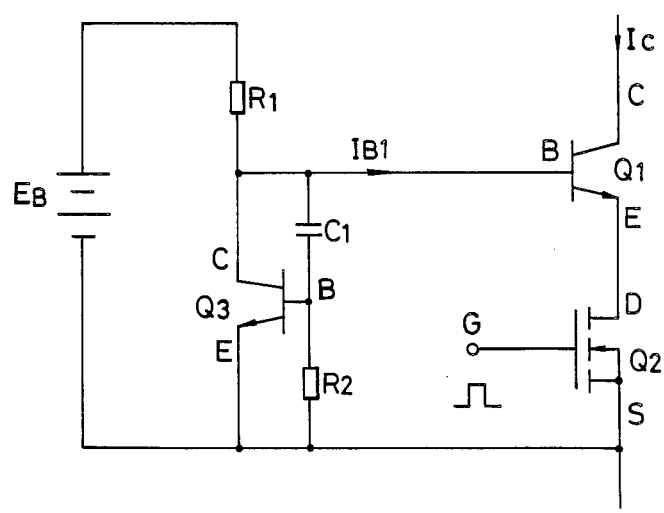
FIG. 2 is a circuit diagram of a semiconductor device for conducting primary current upon receipt of a control signal in accordance with the teachings of the subject invention.

In FIG. 2, the collector C and the emitter E of a third transistor Q3 are connected between the control electrode B of Q1 and the source electrodes of Q2 so that Q3 is capable of shunting the secondary current source IBI away from the base of Q1. Further, a capacitor C1 is connected between the collector C and the base B of transistor Q3 and a resistor R2 is connected between the base B and the emitter E of transistor Q3.

No current flows to the base B of transistor Q3 when transistors Q1 and Q2 are conducting, because secondary current IB1 is absorbed by base B of transistor Q1 and only a nominal voltage exists between the collector and emitter of transistor Q3, which voltage is stored on capacitor C1. Therefore, transistor Q3 is OFF. However, when the voltage across capacitor C1, that is, the voltage between the base B and the collector C of Q3 and, accordingly, between the emitter E and the collector C of Q3 increases (due to transistor Q2 turning OFF in response to control signal G) the secondary current IB1 initially flows through capacitor C1 to render transistor Q3 conductive. However, because the current flowing into the capacitor C1 must initially charge capacitor C1, the voltage between the collector C and the emitter E of transistor Q3 rises at a rate slower than if C1 were not present. The rise rate is determined by the circuit parameters, including the value for the capacitor C1.

As a result of the above-described circuit operation, transistor Q1 is switched OFF. Transistor Q1 will remain OFF until transistor Q2 is rendered conductive once again by control signal G.

When the composite transistors Q1 and Q2 are turned OFF, the voltage between the drain D and the source S of Q2, and thus between the base B of Q1 and the source S of Q2, increases and the carriers accumulated at the base of Q1 are discharged through capacitor C1 and the circuit of transistor Q3 as described above. The voltage between the base B of Q1 and the source S of Q2 rises somewhat slower due to the operation of capacitor C1 and, accordingly, transistor Q3 is delayed in shunting the base current IB1 away from the base B of transistor Q1 and the collector current IC is interrupted somewhat slower. In this way, the magnitude of the spike voltage generated in the external wiring is decreased to prevent destruction of Q1 and Q2.

When Q2 is turned off, the voltage between the collector C and the emitter E of transistor Q3 rises from the voltage level which exists between the base B of Q1 and the source S of Q2 when transistors Q1 and Q2 are ON. Meanwhile, carriers accumulated at the base of Q1 flow mainly through the collector circuit of the auxiliary transistor Q3, rather than through C1, compared to that of the zener diode ZD1 shown in FIG. 1. Therefore, a transistor Q3 of a smaller capacity and reduced cost can be used, saving space and expense.

Figure 3:
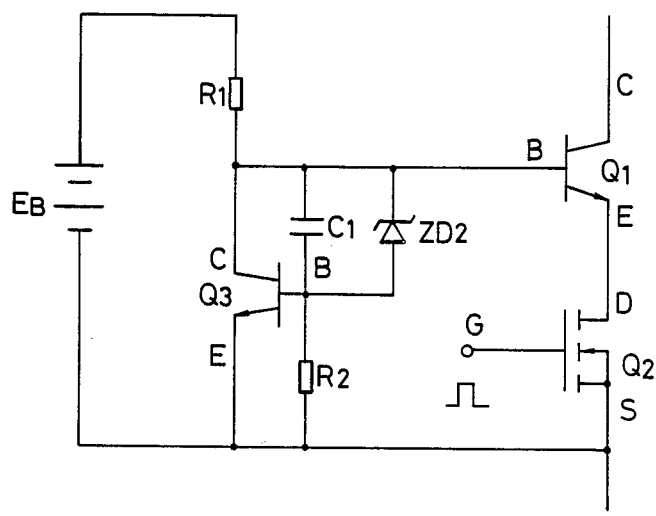
FIG. 3 is a circuit diagram of an alternative embodiment of the circuit illustrated in FIG. 2.

FIG. 3 shows an embodiment of the subject invention in which an additional zener diode ZD2 is attached in parallel with the capacitor C1. ZD2 acts t limit the value of the voltage between the collector C and the emitter E of transistor Q3. Therefore, ZD2 serves to limit the voltage between the base B and the source S of the composite transitors Q1 and Q2 to the avalanche voltage of the zener diode ZD2 in the same way as in FIG. 1, and thus to further prevent damage to transistors Q1 and Q2

Figure 4:
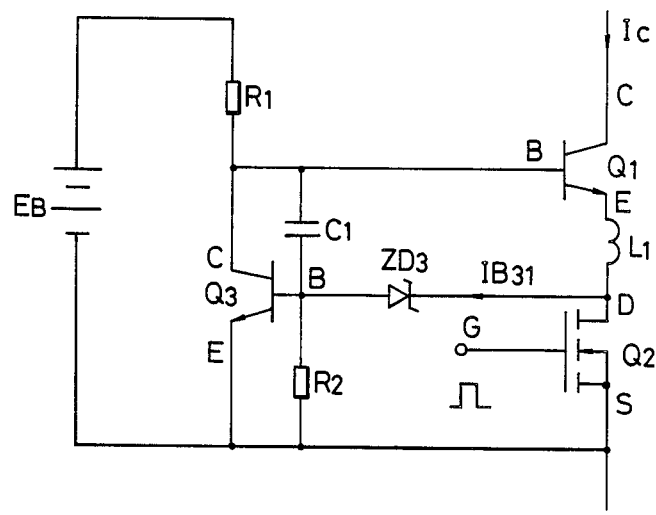
FIG. 4 is a circuit diagram of another semiconductor device for conducting primary current upon receipt of a control signal incorporating the teachings of the subject invention.
Figure 5:
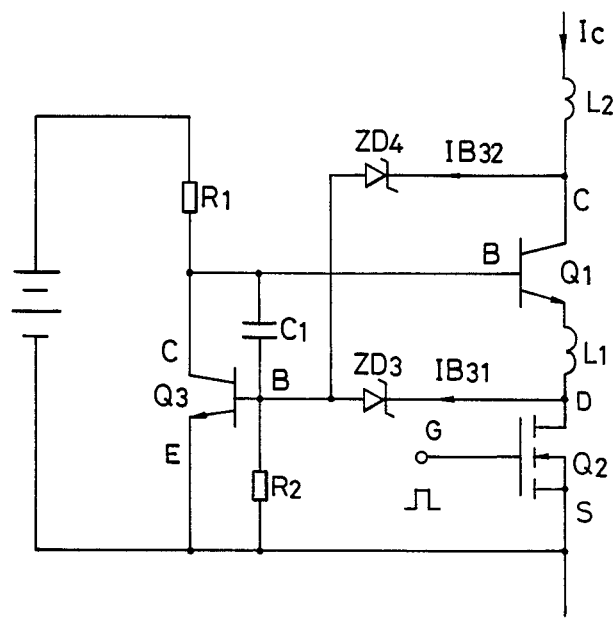
FIG. 5 is an alternative embodiment of the semiconductor device illustrated in FIG. 4.

FIGS. 4 and 5 show an embodiment of the subject invention even more capable of restricting the magnitude of the spike voltage induced by stray inductances L1 (FIG. 4) or L1 and L2 (FIG. 5) in the primary current path, thereby preventing transistor Q1 or Q2 from being destroyed by spike voltages caused by the inductances. In FIGS. 3 and 4, L1 represents the stray inductance of the wiring between the emitter E of Q1 and the drain D of Q2, while L2 in FIG. 4 represents the stray inductance of the external circuit wiring.

Zener diodes ZD3 and ZD4 have avalanche or breakdown voltages selected as follows. The avalanche voltage of ZD3 is selected to be equal to or less than the switching inhibition voltage of Q2, while the avalance voltage of ZD4 is selected to be equal to or less than the maximum allowable voltage between the collector of C of Q1 and the source S of Q2 without damage occurring to Q1 or Q2.

In the embodiments of FIGS. 4 and 5, when the spike voltage induced by the stray inductance L1 exceeds the avalanche voltage for the zener diode ZD3, base current IB31 flows to transistor Q3 by way of the zener diode ZD3. Thus, the increase in the voltage between the base B of Q1 and the source S of Q2 of the composite transistors Q1 and Q2 is moderated in the same manner as in the above described embodiment, i.e., transistor Q3 is turned ON and the voltage between the base B of Q1 and the source S of Q2 is reduced. Accordingly, the speed with which the current IC is interrupted is moderated and the spike voltage generated by the stray inductance is decreased to a non-destruction level. In addition, the voltage between the drain D and the source S of Q2 is restricted to approximately the avalanche voltage of zener diode ZD3, to prevent damage to Q2.

In the same manner, referring to FIG. 5, if the spike voltage induced by stray inductance L2 exceeds the avalanche voltage VZ4 of zener diode ZD4, current IB32 flows to the auxiliary transistor Q3 by way of the zener diode ZD4. The spike voltage is moderated as described above and the voltage between the collector C of Q1 and the source S of Q2 is restricted to approximately the avalanche voltage for the zener diode ZD4, thereby preventing damage to Q1.

Figure 6:
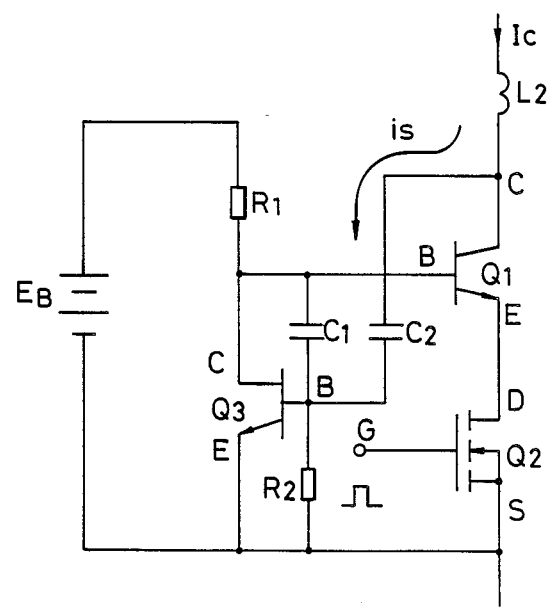
FIG. 6 is yet another embodiment of a semiconductor device for conducting primary current upon receipt of a control signal in accordance with the teachings of the subject invention.

FIG. 6 shows yet another embodiment of a circuit capable of restricting the magnitude of the spike voltage induced by the stray inductance L2 in the current path of transistors Q1 and Q2, thereby preventing damage to transistors Q1 or Q2. In FIG. 6, the circuit of FIG. 2 has added to it an additional capacitor C2 located between the collector C of Q1 and the base B of the auxiliary transistor Q3.

In the circuit of FIG. 6, when transistors Q1 and Q2 are turned ON, current due to the voltage induced by the stray inductance L2 flows to the base B of the auxiliary transistor Q3 by way of the capacitor C2 to turn ON the auxiliary transistor Q3, thereby shunting the current normally flowing from the base power source $E_B$ to the base of Q1 through Q3. Carriers accumulated at the base of Q1 also discharge through Q3, thereby tending to promote the turning-OFF of Q1.

Because the current paths formed by C2 and Q3 acts to shunt excess current induced by voltage spikes away from the composite transistor circuit, the voltage rise between the collector C and the emitter E of transistor Q1 is suppressed and transistor Q1 is protected from damage.

Figure 1:
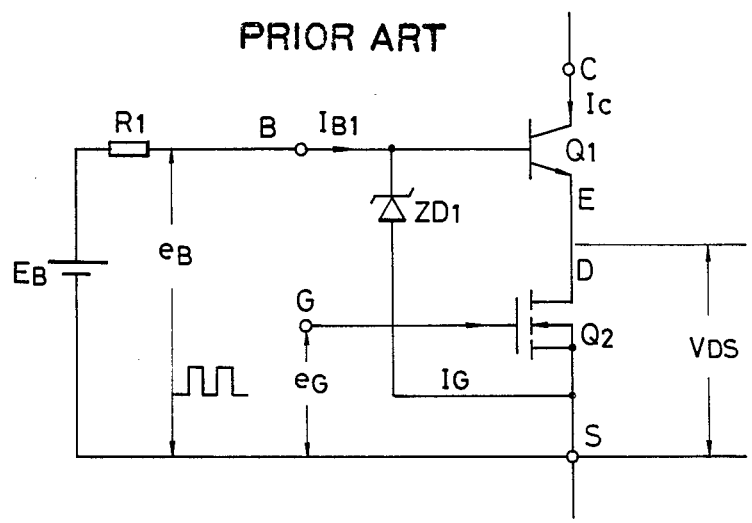
FIG. 1 is a circuit diagram of a prior art semiconductor device for conducting primary current upon receipt of a control signal.

Further, when the circuit is turned OFF, because the voltage between the collector C and the emitter E of transistor Q3 can be made lower than the breakdown voltage for the zener diode ZD1 in the prior art circuit represented by FIG. 1, the heat generated in transistor Q3 is less than that generated in the zener diode ZD1 of the prior art.

The subject invention can also be realized using a low voltage bipolar transistor instead of a field effect transistor for Q2, or by using a field effect transistor instead of the bipolar transistor for Q3 in each of the embodiments shown in FIGS. 2 through 6. However, if a field effect transistor is used as transistor Q3, most of the base current present on the control electrode of transistor Q3 will be shunted to resistor R2. The resistor R2 also constitutes the discharging circuit for the capacitor.

As is apparent from the foregoing descriptions, a semiconductor device is provided in which the emitter of a first bipolar transistor Q1 is connected to the drain (collector) of a second field effect Q2 (or bipolar) transistor to constitute transistors in cascade connection, and the collector-emitter (drain-source) of a third bipolar (or field effect) transistor is connected between the base of the first transistor and the source (emitter) of the second transistor in such a polarity as to be capable of shunting the base current for the first transistor, and a capacitor is connected between the base (gate) of the third transistor and the base of the first transistor, such that the third transistor is temporarily turned ON when the composite transitors Q1 and Q2 are turned OFF and the voltage between the collector and emitter (drain and source) of the third transistor rises from a small value at a rate determined by the value of the capacitor, the switching speed of the composite transistors is also moderated whereby the magnitude of spike voltage is reduced and the heat loss generated in the third transistor due to the discharge of carriers accumulated at the base of the first transistor is reduced, thereby enabling the use of a third transistor of smaller capacity and reduced cost.

What is claimed is:

1. A semiconductor device for conducting primary current upon receipt of a control signal, comprising:
   (a) a first transistor having a control electrode and a primary current path;
   (b) a second transistor have a control electrode coupled to receive said control signal and having a primary current path coupled in series with said primary current path of said first transistor said series current paths including a common junction between said first and second transistors, the resultant series connected primary current paths being coupled to receive said primary current;

(c) a secondary current source for providing a secondary current coupled to said control electrode of said first transistor:

(d) a third transistor having a control electrode and having a current path coupled to said secondary current source to conduct said secondary current from said control electrode of said transistor upon conduction of said third transistor; and (e) a capacitor coupled between said control electrode of said third transistor and said control electrode of said first transistor; said capacitor acting to temporarily render said third transistor conductive when said second transistor is rendered nonconductive by said control signal.

2. A semiconductor device of claim 1 further including a zener diode connected in parallel with said capacitor and coupled between said control electrode of said third transistor and said control electrode of said first transistor and having a polarity orientated to oppose current flow from the control electrode of said first transistor to the control electrode of said third transistor until the breakdown voltage of said zener diode is exceeded.

3. A semiconductor device of claim 1 wherein said first transistor comprises a bipolar transistor.

4. A semiconductor device of claim 3 wherein said second transistor comprises a field effect transistor.

5. A semiconductor device of claim 4 wherein said third transistor comprises a field effect transistor.

6. A semiconductor device of claim 3 wherein said third transistor comprises a bipolar transistor.

7. A semiconductor device of claim 1 wherein a zener diode is connected between the control electrode of said third transistor and said common junction between said first and said second transistors.

8. A semiconductor device of claim 7 including a second zener diode connected between the control electrode of said third transistor and the primary current input of said first transistor.

9. A semiconductor device of claim 1 further comprising a second capacitor connected between the control electrode of said third transistor and the input of said primary current path of said first transistor.

10. A semiconductor device for conducting primary current upon receipt of a control signal, comprising:

(a) a first bipolar transistor having a collector, emitter and base;

(b) a field effect transistor having a gate coupled to receive said control signal and having a drain and source, said drain of said field effect transistor coupled to said emitter of said first bipolar transistor and said collector of said first bipolar transistor coupled to receive said primary current;

(c) a secondary current source coupled to said base of said first bipolar transistor;

(d) a second bipolar transistor having a base, collector of said second bipolar transistor and emitter, said collector connected to the base of said first bipolar transistor and said emitter of said second bipolar transistor connected to the source of said field effect transistor;

(e) a capacitor connected between the base of said second bipolar transistor and the base of said first bipolar transistor; and (f) a zener diode having an anode connected to the base of said second bipolar transistor and a cathode connected to the drain of said field effect transistor, said zener diode having a breakdown voltage selected to not exceed the drain to source voltage of said field effect transistor immediately upon turn-off of said field effect transistor by said control signal.

* * * * *